United States Patent
Chang et al.

(10) Patent No.: US 9,666,302 B1
(45) Date of Patent: May 30, 2017

(54) SYSTEM AND METHOD FOR MEMORY SCAN DESIGN-FOR-TEST

(71) Applicant: TAIWAN SEMICONDUCTOR MANUFACTURING CO., LTD., Hsin-Chu (TW)

(72) Inventors: Ming-Hung Chang, Tainan (TW); Chia-Cheng Chen, Toufen Township (TW); Ching-Wei Wu, Caotun Town (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/980,390

(22) Filed: Dec. 28, 2015

(51) Int. Cl.
| | |
|---|---|
| G01R 31/28 | (2006.01) |
| G11C 29/38 | (2006.01) |
| G11C 29/44 | (2006.01) |
| G11C 11/419 | (2006.01) |
| G11C 11/418 | (2006.01) |

(52) U.S. Cl.
CPC ............ *G11C 29/38* (2013.01); *G11C 11/418* (2013.01); *G11C 11/419* (2013.01); *G11C 29/44* (2013.01)

(58) Field of Classification Search
CPC .... G01R 31/318541; G01R 31/318536; G01R 31/318555; G01R 31/31858; G01R 31/31852
See application file for complete search history.

(56) References Cited

U.S. PATENT DOCUMENTS

| | | | | |
|---|---|---|---|---|
| 5,729,553 | A | * 3/1998 | Motohara | G01R 31/318536 714/726 |
| 6,341,092 | B1 | * 1/2002 | Agrawal | G11C 29/48 365/201 |
| 6,415,401 | B1 | * 7/2002 | Forget | G01R 31/318541 714/724 |
| 8,605,523 | B2 | 12/2013 | Tao et al. | |
| 8,630,132 | B2 | 1/2014 | Cheng et al. | |
| 8,760,948 | B2 | 6/2014 | Tao et al. | |
| 8,908,421 | B2 | 12/2014 | Liaw | |
| 8,929,160 | B2 | 1/2015 | Katoch et al. | |
| 8,964,492 | B2 | 2/2015 | Hsu et al. | |
| 8,982,643 | B2 | 3/2015 | Lum | |
| 9,117,510 | B2 | 8/2015 | Yang et al. | |
| 9,208,858 | B1 | 12/2015 | Lin et al. | |
| 9,218,872 | B1 | 12/2015 | Liaw | |
| 2004/0165071 | A1 | * 8/2004 | Kashiwagi | G01R 31/318555 348/207.99 |
| 2014/0153345 | A1 | 6/2014 | Kim et al. | |

(Continued)

*Primary Examiner* — David Ton
(74) *Attorney, Agent, or Firm* — Duane Morris LLP

(57) ABSTRACT

An IC includes a memory core logic unit, an output unit, and an input unit. The memory logic unit is coupled to a plurality of bit cells configured to control read and write of data to and from the plurality of bit cells. The input unit is formed on the integrated circuit. The output unit is formed on the integrated circuit. The input unit includes a second plurality of multiplexers for signal selection, at least one lock up latch for storing data and configured to increase a hold time for the data, and at least one shadow latch configured to store a copy of the data stored in the at least one lock up latch. The output unit includes a first plurality of multiplexers for signal selection and at least one high phase pass latch for storing data.

24 Claims, 6 Drawing Sheets

(56) References Cited

U.S. PATENT DOCUMENTS

2014/0233330 A1    8/2014   Ko et al.
2015/0348598 A1   12/2015   Wang et al.
2015/0371702 A1   12/2015   Wu et al.
2015/0380077 A1   12/2015   Wu et al.
2015/0380078 A1   12/2015   Liaw

* cited by examiner

SYSTEM AND METHOD FOR MEMORY SCAN DESIGN-FOR-TEST

BACKGROUND

Design-for-Testing or Design for Testability ("DFT") refers to integrated circuit design techniques that add certain testability features to a hardware product design. The DFT features make it easier to develop and apply various manufacturing tests for the designed hardware. The purpose of manufacturing tests is to validate that the hardware products contain no manufacturing defects that could adversely affect the product's proper functioning.

Scan chain is one example of a technique implemented in a DFT process, which makes testing easier by providing a simple way to set and observe every latch in an integrated circuit (IC). The basic structure of a scan chain includes the following set of signals in order to control and observe the scan mechanism. Scan_In (SI) and Scan_Out(SO) are the input and output of a scan chain, respectively. A shift enable pin (SE) is a signal that is added to a design. When SE is asserted, every latch in the design is connected to a respective bit of a shift register. Another control pin called design-for-test bypass (DFTBYP) enables IC into "CAPTURE mode," as SE is not asserted. A clock signal is used for controlling all the latches, or flip-flops, in the chain during testing of the IC. An arbitrary test pattern (for example, a vector of random 0's and 1's) can be entered into the chain of latches, and the state of every latch can be read out.

Test patterns (e.g., binary vectors) are applied as SI inputs to a DFT circuit. Additionally, functional clock signals (e.g., pulses) are sent to the DFT circuit for controlling and timing operation during a "CAPTURE mode," as described in further detail below. The results of a scan test are then shifted out via chip output pins as SO outputs and compared against the expected results. Conventionally, application of scan techniques as described above demands a large amount of memory and test time, and produces large vector sets.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
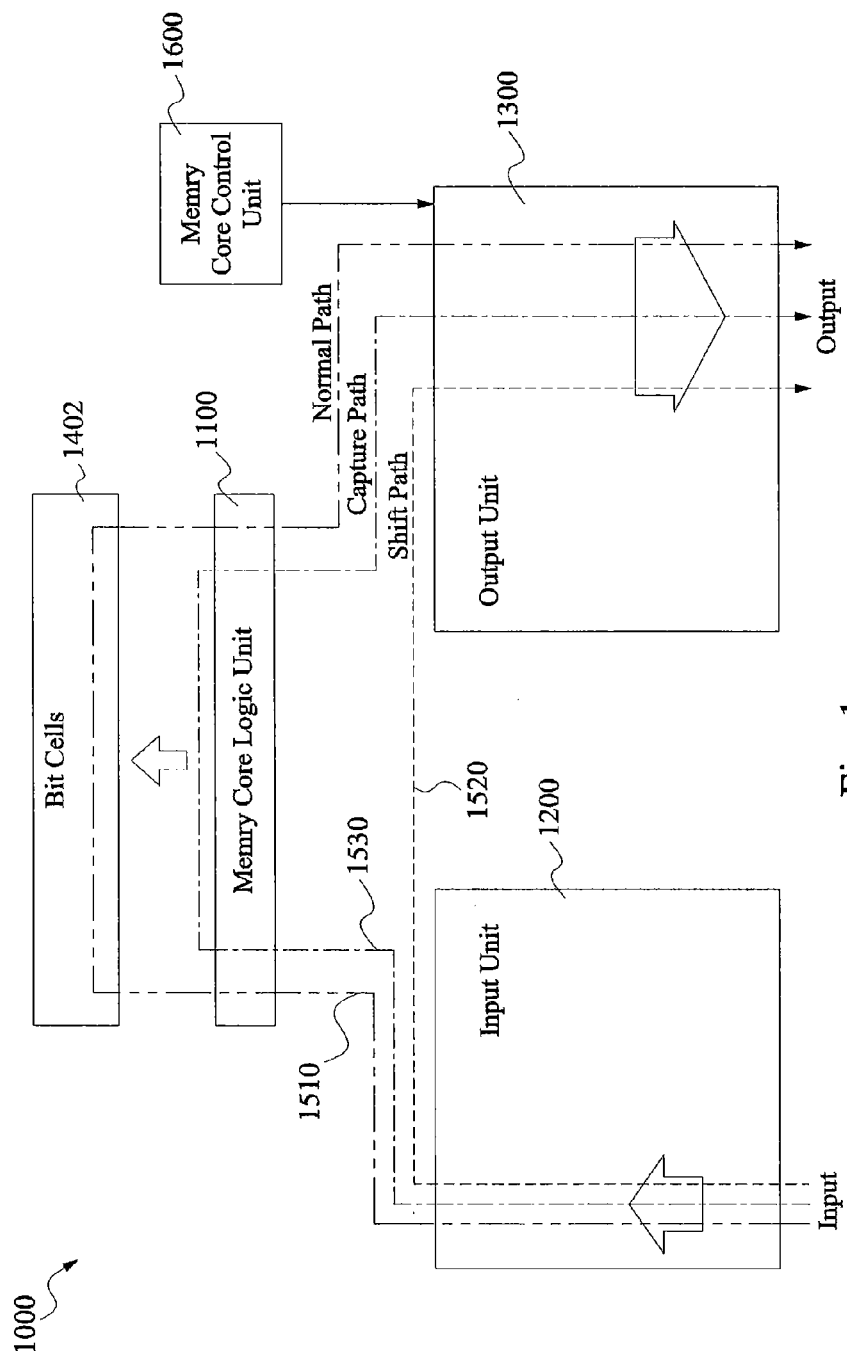
FIG. 1 is a block diagram illustrating a scan DFT circuit.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

FIG. 1 is a block diagram illustrating a scan DFT circuit 1000 in accordance with some embodiments. The scan DFT circuit 1000 includes a memory core logic unit 1100, an input unit 1200, an output) unit 1300, and a memory core control unit 1600 for supplying a Sense Amplifier Enable (SAE) signal which is a periodic signal that functions as a clock signal. A plurality of bit cells are provided by a bit cell unit 1402, containing a plurality of storage units, each capable of storing or recording a single bit of data (e.g., a 1 or 0). In some embodiments, The scan DFT circuit 1000 has three different modes of operation: a NORMAL mode, a SHIFT mode, and a CAPTURE mode. The SHIFT mode includes two sub-modes (states) referred to as SCAN and DEBUG. Thus, there are four states, which can be conveniently mapped to four entries in a 2-bit truth table. In the NORMAL mode, the hardware circuit 1000 does not perform any testing; instead, the hardware performs its regular functionality that it is designed to perform, such as enabling reading and writing of data from/to a memory, e.g., a static random access memory (SRAM). In the SHIFT and CAPTURE modes, test-related features are invoked, and various testing functionality is performed on the hardware by applying certain input data to the hardware and comparing the output data with "designed" output data that the hardware is designed to produce. If the observed output matches the "designed" output then the hardware unit passes the test; if the observed output does not match the "designed" output, the hardware unit fails the test. In SHIFT mode and CAPTURE mode, which can be considered as testing modes, tests are performed on different parts of the hardware unit, as discussed in further detail below.

As shown in FIG. 1, there are three different signal paths through the scan DFT circuit 1000, each path being associated with a respective one of the three modes of operation. A NORMAL path 1510 is associated with the NORMAL mode, a SHIFT path is associated with the SHIFT mode, and a CAPTURE path 1530 is associated with the CAPTURE mode. These modes (NORMAL, SHIFT, CAPTURE) and paths are described in further detail below.

The CAPTURE path 1530 and the SHIFT path 1520 both pass through the input unit 1200. Thereafter, the SHIFT path 1520 provides a path from the input unit 1200 to the output unit 1300. The CAPTURE path 1530 proceeds through the memory core logic unit 1100, and then to the output unit 1300. The NORMAL path 1510 proceeds through the input unit 1200, and then through the memory core logic unit 1100, then through the bit cells 1402, then back to the memory core logic 1100, and then to the output unit 1300. As discussed in further detail below, the memory core logic unit 1100 typically includes a sense amplifier and a plurality of logic gates for sensing low power signals (e.g., 10-50 mV) from respective bit-lines that represent data bits (1 or 0) stored in respective memory cells, and amplifying the small voltage swing to recognizable logic levels so the data can be interpreted properly by logic circuitry coupled to the memory.

As described in further detail below, the input unit 1200 typically includes a plurality of logic gates, multiplexers and latches to control the data flow path. A multiplexer (commonly referred to as MUX) is a device that selects one of several analog or digital input signals and forwards the selected input into a single line at the output of the MUX. In some embodiments, a multiplexer of $2^n$ inputs has n select lines, which are used to select which input line to send to the output, and the multiplexer is controlled by a control signal called a selector signal. As discussed in further detail below, the output unit 1300 typically includes output elements, such as, but not limited to, shift-in data registers and shift-out data registers. In some embodiments, the scan DFT circuit 1000 is implemented as two distinct units: a data scan unit and a control scan unit. The data scan unit performs testing on data-related functions, and the control scan unit performs testing on control-related functions.

In some embodiments, the scan DFT circuit 1000 adds testing capability to designed IC hardware to make it easier to develop and apply manufacturing tests. In some embodiments, manufacturing test is to validate that the IC hardware product contains no manufacturing defects that adversely affect the proper functioning of the IC hardware. The tests are generally driven by test programs that execute in Automatic Test Equipment (ATE) or inside the assembled system itself. In addition to detecting and indicating the presence of defects when a test fails, in some embodiments, tests are able to log diagnostic information about the nature of the encountered test failures. The diagnostic information can be used to locate the source of the failure. In the test, the response of vectors (patterns) from a "good" circuit (one that is known to be operating correctly) is compared against the response of vectors (using same patterns) from a device under test (DUT). If the response matches, the IC is in good condition. Otherwise, the IC contains defects and does not perform the purpose for which it is designed.

In some embodiments, circuit 1000 adds testing capability to memory input/output circuits by providing shared components that can be used for both testing purposes and normal operation within a single IC chip, depending on a mode of operation. By using circuit components such as multiplexers and latches as described in further detail below, various embodiments provide multiple processing paths using shared hardware on an IC chip, reducing chip area and the number of components.

Figure 2:
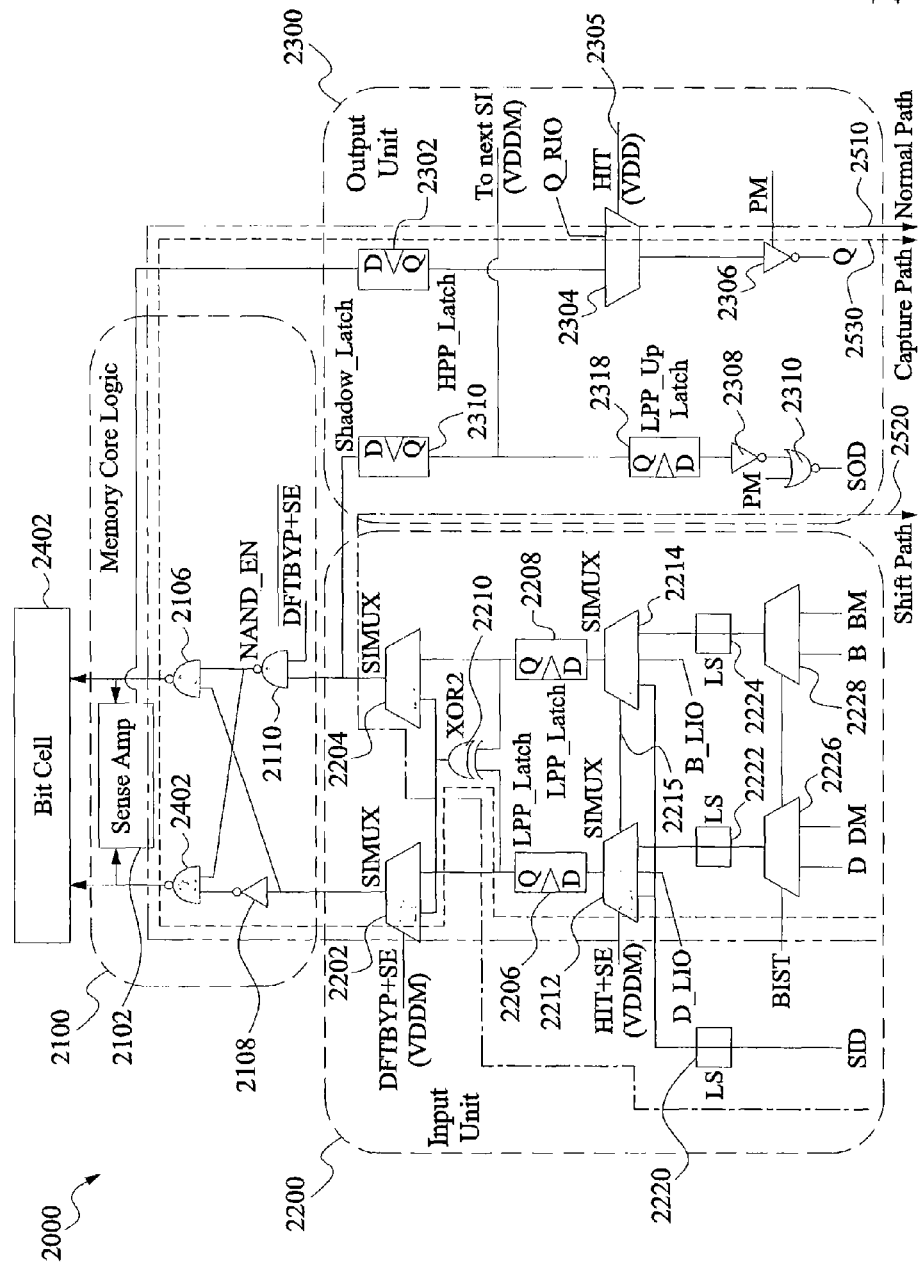
FIG. 2 is a schematic diagram illustrating a data scan chain unit of a scan DFT circuit in accordance with some embodiments.

FIG. 2 is a schematic diagram of a data scan unit 2000 of a scan DFT circuit in accordance with some embodiments. Data scan unit 2000 includes a memory core logic unit 2100, an input unit 2200, and an output unit 2300, which may be the same as the memory core logic unit 1100, the input unit 1200, and the output unit 1300, respectively. The memory core logic unit 2100 includes a sense amplifier 2102, NAND gates 2104, 2106 and 2110, and an inverter 2108. The NAND gate 2110 is controlled by a signal designated as "DFTBYP+SE Bar", where "Bar" signifies a logic inversion (complement). DFTBYP stands for Design-For-Testing-BY-Pass, and SE stands for Shift-Enabled. The NAND_EN signal can be used to bypass a predetermined operation, such as a Bit-Write-Enabled-Bar function which performs logical inversion of enabling a bit write signal.

The NAND gate 2104 has two inputs connected to the output of inverter 2108 and the output of NAND gate 2110, respectively. The NAND gate 2106 has two inputs connected to the output of the NAND gate 2110 and the input of inverter 2108, respectively. The outputs of NAND gates 2104 and 2106 are coupled to the sense amplifier 2102. The sense amplifier 2102, in some embodiments, amplifies a small voltage swing to recognizable logic levels so the data can be interpreted properly by logic outside the memory. A bit cell unit 1402 contains a plurality of bit cells for storing data (e.g., logic 1's and 0's), and in various embodiments can function or be implemented as permanent memory, temporary memory, or buffers, for example, as desired or appropriate for specific applications.

As shown in FIG. 2, the input unit 2200 includes: four Shift Input Multiplexers (SIMUXes) 2202 2204, 2212 and 2214, a gated Data latch (D latch) 2206, a Low Phase Pass Latch (LPP_Latch) 2208, MUXes 2226 and 2228 and an XOR gate 2210, which may be a an Exclusive OR (XOR) gate with two inputs or a different number of inputs. The input unit 2200 also includes three optional level shifters 2220, 2222 and 2224, which are discussed in further detail below. The output unit 2300 includes a gated D Latch (High-Phase Pass Latch, or HPP_Latch) 2302, a MUX 2304, a Shadow_Latch 2316, a LockUp_Latch 2318, a tri-state inverter 2306, an inverter 2308, and a NOR gate 2310. Further details regarding the input unit 2200, the output unit 2300 and the interaction between the input unit 2200 and the output unit 2300 are described below.

A SIMUX is a multiplexer that is used to shift input data into devices such as latches. A Low Phase Pass latch (LPP_Latch) is a latch that allows data to pass through when the clock phase is low (logic level 0); in comparison, a High-Phase Pass Latch (HPP_Latch) is a latch that allows data to pass through when the clock phase is high (logic level 1). The LPP_Latches 2206 and 2208 are implemented to unify setup/hold timing for SRAM NORMAL and scan DFT operations. In some embodiments, the LPP_Latches 2206 and 2208 are shared among NORMAL, SHIFT and CAPTURE modes and paths, and this sharing contributes to area overhead reduction because additional latches are not required for different modes and paths.

In some embodiments, a shadow latch is a latch in which data can be stored and maintained during normal operation. In some embodiments, the shadow latch 2316 has an input (D) that accepts an input signal, a clock input for accepting a clock signal, and an output (Q) that outputs a shadow-Q signal with a value equal to an inverted Q signal value. In some embodiments, the output Q of the shadow latch 2316 is supplied in response to an output signal from the sense amplifier 2102 and a clock signal (not shown), which can be any clock signal provided by or to the integrated circuit (not shown) that contains the DFT circuit 2000. Lock-up latches are designed to avoid skew problems during shift phases of scan-based testing. As shown in FIG. 2, the lock-up latch 2318 has an input (D) coupled to the output (Q) of the shadow latch 2316. In some embodiments, the lock-up latch 2318 is a transparent latch used in circuit locations where clock skew is relatively large and it is difficult to meet hold times due to relatively large clock paths. In some embodiments, the Lock-up latch 2318 is a component in scan-based designs for increasing hold times between shift modes.

As shown in FIG. 2, the output of the XOR gate 2210 is provided as a first input to each one of SIMUX 2202 and SIMUX 2204. The XOR gate 2210 is implemented for input vector compression. The XOR gate 2210 with m inputs breaks long scan chains (e.g., bit sequences) into groups of shorter chains. For example, if the length of the scan chain is 100 bits and the number of inputs m is 2, as shown FIG. 2, then the XOR gate 2210 breaks the scan chain down to 2 shorter chains of 50 bits each. The XOR gate 2210 also recombines each group of chains into a single output stream with some or all redundant information removed. According to some embodiments, the input vectors (fed to the input unit 2200) contain large amount of redundant information, used primarily for detecting and/or correcting errors. Thus, input vector compression to remove all or some of this redundancy reduces input test vector volume. Additionally, on-chip compression of scan-out data further reduces test times and scan-out data volume.

An output of LPP latch 2206 is provided as a second input of the SIMUX 2202 and a first input of the XOR gate 2210. Similarly, an output of LPP latch 2208 is provided as a second input of the SIMUX 2204 and a second input of XOR gate 2210. SIMUXes 2202 and 2204 are implemented to support NORMAL/SHIFT/CAPTURE mode selection. The SIMUXes 2202 and 2204 are both controlled by selector signal DFTBYP+SE, and the mode and path selection among NORMAL/SHIFT/CAPTURE is controlled by the value of selector signal DFTBYP+SE. The D input of the LPP_Latch 2206 is connected to the output of SIMUX 2212. The D input of the LPP_Latch 2208 is connected to the output of SIMUX 2214. The first inputs of both SIMUXes 2212 and 2214 are connected to the SID (e.g., Shift-In Data) through optional level shifter 2220, which shifts input signal levels to a desired output signal level in accordance with system requirements. The second input of SIMUX 2212 is connected to D_LIO (Data Left Input-Output), and the second input of the SIMUX 2214 is connected to B_LIO (Bit Left Input-Output). The D_LIO & B_LIO signals are provided for column redundancy where redundancy architecture uses binary cells (having two possible values) to indicate whether a given row or column of memory cells is faulty. The selectors of SIMUX 2212 and SIMUX 2214 are connected together as shown by line 2215, which is connected to a control signal line (not shown). The third inputs of the SIMUXes 2212 and 2214 are connected to outputs of MUXes 2228 and 2226, as discussed in further detail below. The D input of the Shadow_Latch 2316 is connected to the output of SIMUX 2204 and one input of the NAND gate 2110. The Q output of the Shadow Latch 2316 is connected to the D input of the LockUp_Latch 2318. In some embodiments, the Shadow_Latch 2316 is implemented to store an exact copy of scan-in data or captured data that is stored in the Lock-up latch 2317 of the output unit 2300. In further steps of design-for-tests, the data stored in the Shadow_Latch 2316 is shifted out for comparison and testing purposes to verify the hardware design.

In the system 2000 illustrated in FIG. 2, signals are propagated between the input unit 2200 and the output unit 2300. Various signal paths are discussed herein. The output of the MUX 2226 is connected to the third input of the SIMUX 2212 and the output of the MUX 2228 is connected to the third input of the SIMUX 2214. The Q output of the LockUp_Latch 2318 is connected to the input of the inverter 2308, whose output is transmitted to one of the inputs of the NOR gate 2310. Hold-time is the minimum amount of time the data signal should be held steady after the clock event so that the data are reliably sampled. The LockUp_Latch 2318 is implemented to increase hold times, which is explained in further detail below with reference to FIG. 4. Hold-time-free design, also known as zero-hold-time design, is used when it is hard to meet hold time requirements as discussed previously in connection with the lock up latch 2318. As shown in FIG. 2, the input of HPP_Latch 2302 is coupled to an output of the sense amplifier 2102, while the Q output of HPP_Latch 2302 is coupled to an input of the MUX 2304, whose output is transmitted to the input of the inverter 2306.

In one embodiment, the Shadow_Latch 2316 and Lockup_Latch 2318 share a common clocking signal such as 4202 in FIG. 4B, which is described in further detail below. A shared output latch clocking signal (shown in FIG. 4B as 4202 CLK) is implemented to unify tCD (clock to Q timing, also known as "tckq") timing for normal memory (e.g., SRAM) and scan DFT operations. The implementation of a shared output latch clocking signal does not require extra replica circuits for tCD timing tracking. Similar to shared input latches (e.g., 2206, 2208) among different mode signal paths, as discussed above, the implementation of shared output latches (e.g., 2316, 2318, 2302) also contributes to IC area overhead reduction, because no additional latches are needed for different modes and paths. The circuit architecture for data scan chain implemented above enables synchronous write-through and implementation of conventional truth tables, which provide compatibility with conventional testing processes. For example, test programs developed for conventional testing can be transplanted to be used in the embodiments discussed above, because such test programs and various embodiments use the same truth tables. Further details of an exemplary truth table are discussed below along with descriptions of how signals can propagate between the input unit 2200 and the output unit 2300, in accordance with some embodiments.

As discussed for FIG. 1, there are three different paths associated with the NORMAL mode, the CAPTURE mode and the SHIFT mode, respectively. The selection of the modes is determined by the following truth table. When DFTBYP+SE=00 (where '+' denotes logical OR operation), the system is in NORMAL mode; when DFTBYP+SE=01, the system is in DEBUG SHIFT mode; when DFTBYP+SE=10, the system is in CAPTURE mode; when DFTBYP+SE=11, the system is in SCAN SHIFT mode. As discussed herein, SHIFT mode refers to both DEBUG SHIFT and SCAN SHIFT modes. As explained previously, DFTBYP stands for Design-For-Testing-BYpass. In the NORMAL mode, DFTBYP+SE=00, signals D and DM of the MUX 2226 are transmitted to the SIMUX 2212 through the optional level shifter 2222, and signals B and BM of the MUX 2228 are transmitted to the MUX 2214 through the optional level shifter 2224. Both the SIMUXes 2212 and 2214 are controlled by a selector signal HIT+SE 2215 (HIT is a control signal for column redundancy multiplexer, SE stands for Shift Enable). The selector signal HIT+SE 2215 is provided by another portion of the circuit (not shown). Depending on the settings of HIT+SE, the D or DM input signals to the SIMUX 2228 and the B or BM input signal of the SIMUX 2226 are transmitted as output signals to the D inputs of the LPP_Latches 2206 and 2208, respectively.

The output of the LPP_Latches 2206 and 2208 are then transmitted to SIMUX's 2202 and 2204, respectively, which are both controlled by selector signal DFTBYP+SE, as discussed above. The output of the SIMUX 2202 is then transmitted to the input of the inverter 2108 and a first input of the NAND gate 2106. The output of the SIMUX 2204 is provided to a first input of the NAND gate (NAND_EN) 2110. The output of the NAND gate (NAND_EN) 2110 is provided to the second inputs of NAND gates 2104 and 2106, respectively. The outputs of NAND gate 2104 and 2106 are provided to the sense amplifier 2102 and to bit cell unit 2402 for storage during a write operation (NORMAL mode) or scan test (SHIFT or CONTROL modes).

During NORMAL and CAPTURE modes, the sense amplifier 2102 also provides the output of NAND gates 2104 and 2106 to the HPP_Latch 2302 for temporary storage of test data. The MUX 2304 is controlled by a selector signal 2305, which is provided by another portion of the circuit (not shown). In the NORMAL mode, the signal passes through the MUX 2304, then passes through the tri-state inverter 2306. The NORMAL path associated with the NORMAL mode is shown as 2510 in FIG. 2. In the CAPTURE mode, the path is similar to the NORMAL mode, except that the signals discussed above pass through the XOR 2210 before signal flow proceeds to the SIMUXes 2202 and 2204. The CAPTURE path associated with the CAPTURE mode is shown as 2530 in FIG. 2.

In the SHIFT mode, the SID signal is provided to the optional level shifter 2220, which shifts the amplitude of the SID signal to a desired level. The signal is then provided to both the first input of the SIMUX 2212 and the first input of the SIMUX 2214. The outputs of the SIMUX 2212, which is controlled by the selector signal HIT+SE, as discussed above, is then provided to LPP_Latch 2206, which then outputs a signal to a first input of the XOR gate 2210. Similarly, the output of SIMUX 2214, which is also controlled by the selector signal HIT_SE, is provided to LPP_Latch 2208, which then outputs a signal to a second input of the XOR gate 2210. The output of XOR gate 2210 is then provided to first input SIMUX 2204, which is controlled by a selector signal DFTBYP+SE, as discussed above. The output of the SIMUX 2204 is then provided to the input (D) of the Shadow_Latch 2316, which then outputs the latched value to the input of the LockUp Latch 2318. The Lockup Latch 2318 then provides the latched value to the inverter 2308, which inverts the value and thereafter provides the inverted value to the NOR gate 2310. The output of the NOR gate 2310 is the shift-out data (SOD), which is a result of a NOR logic function of the output of inverter 2308 and an enable control signal, which is labeled PM in FIG. 2. The SHIFT path associated with the SHIFT mode is shown as dashed line 2520, which traces the path along SIMUX 2212 and LPP_Latch 2206. As discussed above, a parallel path includes SIMUX 2214 and LPP_Latch 2208. For the clarity of the illustration, dashed line 2520 only traces SIMUX 2212 and LPP_Latch 2206.

Figure 3:
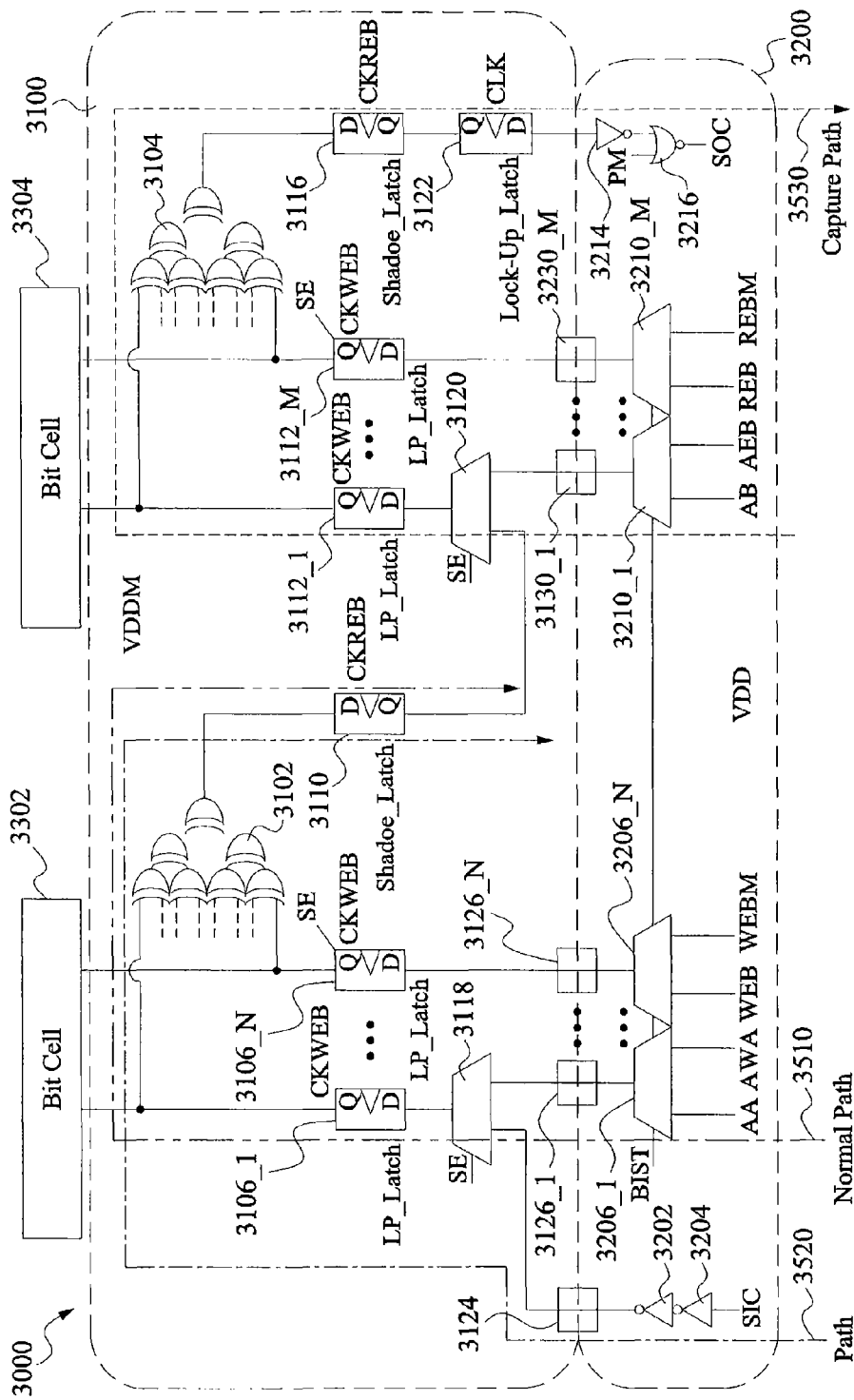
FIG. 3 is a schematic diagram illustrating a control scan chain unit for a scan DFT circuit in accordance with some embodiments.

FIG. 3 is a schematic diagram illustrating a control scan chain unit for scan DFT circuit in accordance with some embodiments. Compared to the data scan chain unit, the control scan chain unit does not have a memory core logic unit. A control scan chain contains a list of control bits, which constitute test data provided to a first unit 3100 and a second unit 3200 for performing scan chain tests as discussed herein. The first unit 3100 includes a first group of XOR gates 3102 and a second group of XOR gates 3104. There are N input latches LP_Latches 3106_1, . . . , 3106_N whose Q outputs are connected to the corresponding inputs of the first group of XOR gates 3102. There are N corresponding optional level shifters 3126_1 through 3126_N, which receive output from corresponding MUX's 3206_1 through 3206_N located in the second unit 3200. Input signals to MUXes 3206_1 through 3206_N and 3210_1 through 3210_M are AA, AMA, WEB, WEBM, AB, AMB, REB and REBM, etc., which can be any desired signals for performing scan chain testing. The selector of all MUXes 3206_1 through 3206_N and 3210_1 through 3210_M are connected together and controlled by a signal labeled BIST. The selectors of MUXes 3118 and 3120 are both controlled by a SE (Shift Enabled) control signal. The D input of the first LP_Latch 3106_1 is connected to the output of a MUX 3118 which is controlled by a selector signal SE (Shift Enabled), as discussed in further detail below.

There are also M input latches LP_Latches 3112_1, . . . , 3112_M whose Q outputs are connected to the corresponding input of the second group of XOR gates 3104. The D input of the first LP_Latch 3112_1 is connected to the output of a MUX 3120 which is also controlled by selector signal SE, as discussed in further detail below. There are M corresponding level shifters 3130_1 through 3130_M which receive output from corresponding MUXes 3210_1 through 3210_M, respectively.

The output of the first group of XOR gates 3102 is connected to the D input of a Shadow_Latch 3110, and the output of the second group of XOR gates 3104 is connected to the D input of a Shadow_Latch 3116. The Q output of the Shadow_Latch 3110 is connected to an input of MUX 3120, whose output is connected to the D input of the LP_Latch 3112_1. The Q output of the Shadow_Latch 3116 is connected to the Q output of the LockUp_Latch 3122, whose D input is connected to an input of an inverter 3214. The output of the inverter 3214 is connected to the input of a NOR gate 3216.

Two inverters 3202 and 3204 are connected in serial, and the output of the inverter 3202 is connected to a level shifter 3124, which shifts the amplitude inverter 3202 output to a desired level and thereafter provides it to one input of the MUX 3118. Similarly, the output of a MUX 3206_1 is provided to level shifter 3126_1, which thereafter provides the shifted signal to the other input of the MUX 3118. The output of a MUX 3206_N is connected to level shifter 3126_N, which then provides the level-shifted signal to the D input of the LP_Latch 3106_N.

As shown in FIG. 3, the output of a MUX 3210-1 is connected to the input of level shifter 3130_1 which shifts the amplitude of the signal to a desired level and thereafter provides the signal to a second input of the MUX 3120. Similarly, the output of a MUX 3120_M is connected to the D input of the LP_Latch 3112_M through level shifter 3130_M. In SHIFT mode, the selector signal SE is used to provide low logic level signals (e.g., a 0 logical value) to multiple input latches (e.g., latches 3106_1 and 3112_1). As discussed above, the implementation of shared input latches (e.g., 3106_1 through 3106_N) decreases the depth of a scan chain and reduces area overhead. Bit cell units 3302 and 3304 each contain a plurality of bit cells similar to the bit cell unit 1402, discussed above in connection with FIG. 1.

In the NORMAL mode, signals from the MUXes 3206_1 through 3206_N pass through corresponding LP_Latches 3106_1 . . . 3106_N, then to the first group of XOR gates 3102. There is an additional MUX 3118 controlled by the selector signal SE between MUX 3206_1 and LP_Latch 3106_1. In some embodiments, all MUXes 3206_1 through 3206_N are connected by a common selector signal, e.g., a built-in self-test (BIST) control signal provided by another circuit (not shown). The NORMAL path associated with the NORMAL mode is 3510. For clarity of illustration, only one NORMAL path along MUX 3206_1, level shifter 3126_1, MUX 3118 and LP_Latch 3106_1 is marked in FIG. 3, but it should be understood that there is such a NORMAL path along each group of MUX 3206_i, level shifter 3126_i and LP_Latch 3106_i, where i is from 2 to N. In the SHIFT mode, the path is similar to the first NORMAL path except that prior to the MUX 3118, the signal comes from inverters 3202 and 3204 and level shifter 3124. The SHIFT path associated with the SHIFT mode is 3520.

In the CAPTURE mode, the signals from the MUXes 3210_1 ... 3210_M pass through the corresponding level shifters 3130_1 ... 3130_M, then through the corresponding LP_Latches 3112_1, ... 3112_M. In some embodiments, the MUXes 3210_1 ... 3210_M are all controlled by the same selector signal as MUXes 3206_1 ... 3206_N, e.g., a BIST control signal as mentioned above. There is an additional MUX 3120 controlled by selector signal SE between the level shifter 3130_1 and LP_Latch 3112_1. The outputs from LP_Latches 3112_1 ... 3112_M then pass through the second group of XOR's 3104, then pass through Shadow_Latch 3116 and LockUp_Latch 3122, then through the inverter 3214 and the NOR gate 3216. The CAPTURE path associated with the CAPTURE mode is represented by dashed line 3530. For clarity of illustration, only one CAPTURE path along MUX 3210_1, level shifter 3130_1, MUX 3120 and LP_Latch 3112_1 is marked in FIG. 3, but it should be understood that there is such a CAPTURE path along each group of MUX 3210_i, level shifter 3130_i and LP_Latch 3112_i, where i ranges from 2 to M.

Figure 4A:
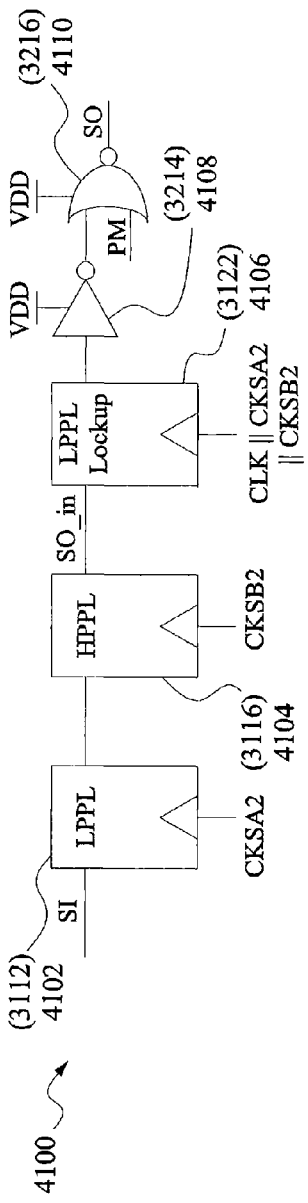
FIG. 4A is a schematic diagram illustrating lock-up latches in accordance with some embodiments.

FIG. 4A is a schematic diagram illustrating the clocking of various latches (LPPL 4102, HPPL 4104, LPPL 4106, etc.), in accordance with some embodiments. An input signal SI (e.g., Shift-In) is transmitted to the D input of a Low Phase Pass Latch (LPPL) 4102, which then transmits its Q output to the D input of a High Phase Pass Latch (HPPL) 4104. The Q output of the HPPL 4104 is then transmitted to the D input of a low phase pass latch, Lockup latch 4106. As shown in FIG. 4A, the clock of latch 4102 is designated as "CKSA2", the clock of latch 4104 is designated as "CKSB2", and the clock of latch 4106 is designated as "CLK∥CKSA2∥CKSB2" which means CLK "OR" CKSA2 "OR" CKSB2. The Q output of the LPPL Lockup latch 4106 is transmitted to the input of an inverter 4108, which inverts the input to produce an output. The inverted output is then transmitted to one of the inputs of a NOR gate 4110. The output of NOR gate 4110 is the SO (e.g., Shift-Out) signal.

Referring to FIG. 3, in some embodiments, the LPPL (Low-Phase Pass Latch) 4102 can be LP_Latch 3112_1 (or any one of 3112_1 through 3112_M), HPPL (High-Phase Pass Latch) 4104 can be the Shadow_Latch 3116, the LPPL LockUp_Latch 4106 can be the LockUp_Latch 3122, the inverter 4108 can be the inverter 3214, and the NOR gate 4110 can be the NOR gate 3216. Referring to FIG. 2, in some embodiments, the LPPL (Low-Phase Pass Latch) 4102 can be LP_Latch 2206 (or 2208), HPPL (High-Phase Pass Latch) 4104 can be the Shadow_Latch 2316, the LPPL LockUp_Latch 4106 can be the LockUp_Latch 2318, the inverter 4108 can be the inverter 2308, and the NOR gate 4110 can be the NOR gate 2310.

Figure 4B:
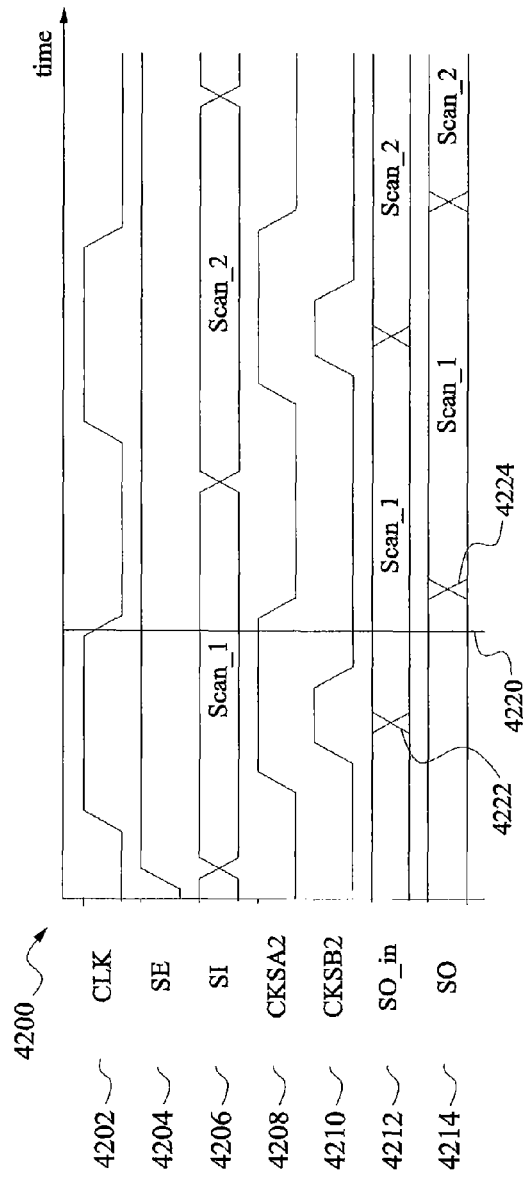
FIG. 4B is a schematic diagram illustrating clock cycles of lock-up latches in FIG. 4A in accordance with some embodiments.

FIG. 4B is a signal timing diagram of various clock signals that are used to operate the various latches shown in FIG. 4A, in accordance with some embodiments. As shown in FIG. 4B, a first signal CLK 4202 is a system clock signal that can be an external clock signal provided to the integrated circuit or any other clock signal; a second signal SE 4204 is Shift Enabled signal, which enables shifting when the phase is high; a third signal SI 4206 is Shift In, which is the input of LPPL 4102; a fourth signal 4208 CKSA2 is a second clock signal that controls the LPPL 4102; a fifth signal 4210 CKSB2 is a third clock signal that controls HPPL 4104; a sixth signal 4212 SO_in is a signal between HPPL 4102 and LPPL 4106; a seventh signal 4214 SO is shift out, which is the output of NAND 4110. In some embodiments, an "OR" logic operation is performed on clock signals CLK 4202, CKSA2 4208 and CKSB2 4210 produce a clock signal for LPPL Lockup Latch 4106. The result of such an OR operation is only low when all of the inputs to the OR are low. Thus, a falling edge of the resulting clock signal (designated as "CLK∥CKSA2∥CKSB2") is delayed until all of the inputs (CLK 4202, CKSA2 4208, CKSB2 4210) are low. In some embodiments, the output of LPPL latch 4106 is triggered by the falling edge of its resulting clock signal. This effectively extends the hold time of SO_in 4212 from a first time designated by X 4222 to a second time designated by X 4224 for SO signal 4214. The logic OR operation delays the falling edge of the resulting clock signal so as to delay the transition 4222 to time 4224, when all three clock signals (CLK, CKSA2 and CKSB2) are low. Thus, the input signal of LPPL 4106 SO_in is effectively delayed by the logic OR of three clock signals to produce an extended output valid time on the output SO of NAND 4110, thereby increasing the data hold time for SO so that it is reliably sampled. The vertical line 4220 represents the falling edge of the system clock CLK and shows respective time offsets of the falling edges of clock signals CKSA2 and CKSB2.

In summary, the SE signal enables shifting when its level is "high." If SE is "low," shifting is disabled. When shifting is enabled, SI shifts in data in each scan. Between HPPL 4104 and LPPL 4106, signal SO_in 4212 is measured. The function of LPPL 4106 is to extend (i.e., delay) SO_in signal 4222, as described above. Such extension, or delay, is achieved by taking logic OR of three clock signals CLK, CKSA2, and CKSB2 and triggering the output of LPPL 4106 upon the falling edge of the resulting clock signal. Thus, the logic OR of a plurality of clock signals (e.g., CLK, CKSA2, and CKSB2) delays the output of LPPL 4106. This effectively extends, or delays, SO_in from time 4222 to time 4224.

Figure 5:
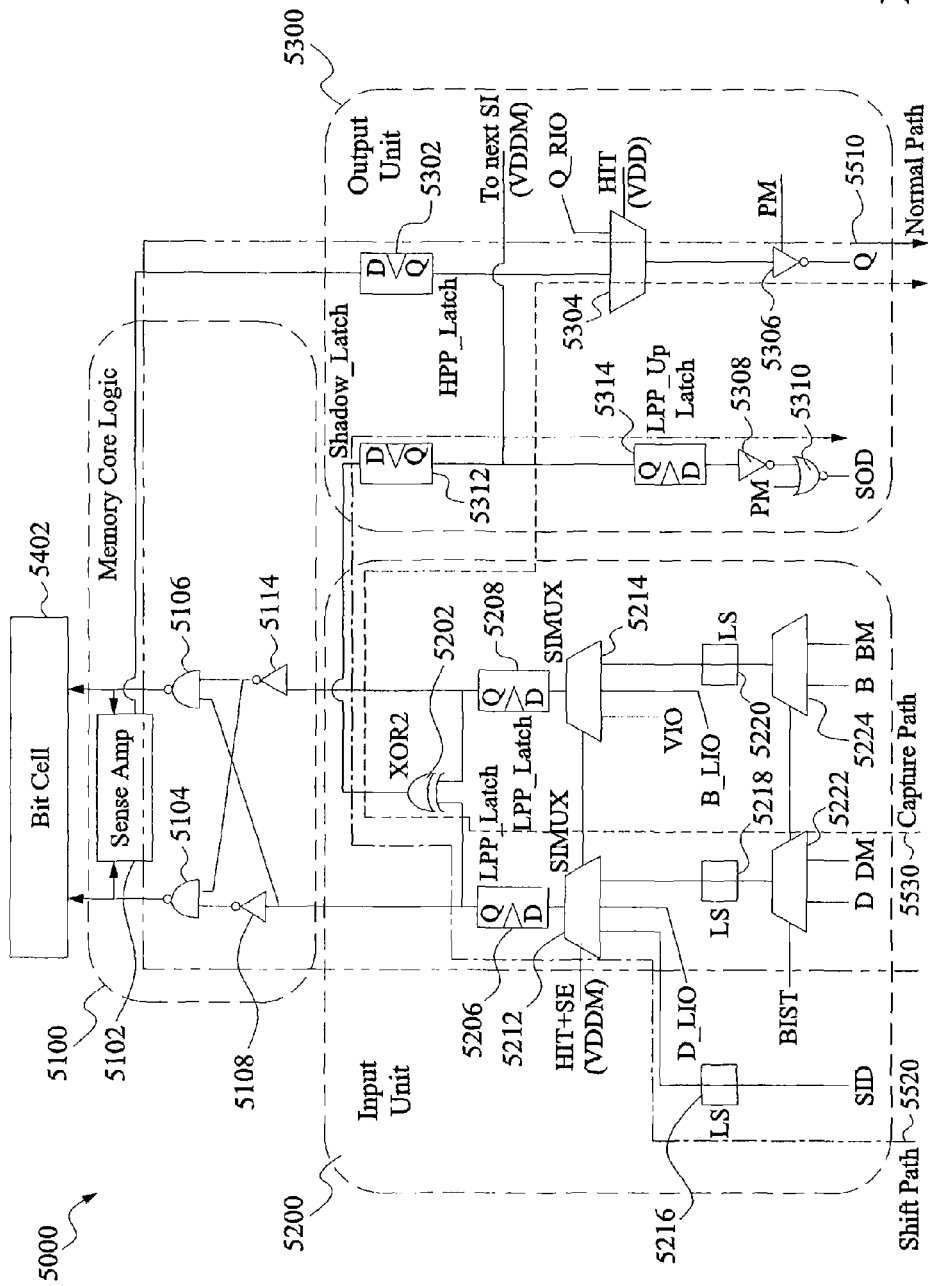
FIG. 5 is a schematic diagram illustrating a scan DFT circuit in accordance with some embodiments.

FIG. 5 is a schematic diagram illustrating a scan DFT circuit 5000 in accordance with some embodiments. The scan DFT circuit 5000 includes three units as follows: a memory core logic unit 5100, an input unit 5200, and an output unit 5300. Unit 5402 is a bit cell unit including a plurality of bit cells as discussed above. The overall architecture of the scan DFT circuit 5000 shown in FIG. 5 is similar to the architecture shown in FIG. 2, except that the SIMUXes 2202 and 2204 are omitted, and NAND gate 2110 is replaced by an inverter 5110. The scan DFT circuit 5000 supports a memory bypass function, and is discussed in further detail below.

The memory core logic unit 5100 includes a sense amplifier 5102, NAND gates 5104 and 5106, and inverters 5108 and 5110. In some embodiments, NAND gate 5104 has inputs coupled to the output of inverter 5108 and the output of inverter 5110, and NAND gate 5106 has inputs coupled to the output of inverter 5110 and the input of inverter 5108. The outputs of NAND gates 5104 and 5106 are passed to the sense amplifier 5102.

The input unit 5200 includes LPP_Latches 5206 and 5208, XOR gate 5202, SIMUXes 5212 and 5214 and MUXes 5224 and 5222. The output unit 5300 includes a HPP_Latch 5302, a Shift Output Multiplexer (SOMUX) 5304, inverters 5306 and 5308, an NOR gate 5310, a Shadow_Latch 5312, a LockUp_Latch 5314.

As shown in FIG. 5, a SOMUX is a multiplexer that is used to shift output data out of devices such as latches. The inputs of the XOR 5202 are connected to the Q outputs of the LPP_Latches 5206 and 5208, and then connected to the input of the inverters 5108 and 5110 respectively. The XOR is implemented for D/BWEB input vector compression as discussed above. The output of the XOR 5202 is connected to the D input of the Shadow_Latch 5312, whose Q output is connected to the D input of the LockUp_Latch 5314. The Shadow_Latch 5312 is implemented to store scan-in or captured data using the identical clock signal as normal data output latch. The LockUp_Latch 5314 is implemented to delay output valid timing for zero-hold-time design, as discussed above. The SIMUX 5212 receives three inputs from SID, D_LIO and the output of the MUX 5222. The SIMUX 5214 receives three inputs from VLO (e.g., tied to voltage low, which means always logic 0.), B_LIO (Bit Left Input-Output) and the output of the MUX 5224, respectively. Both MUX 5224 and MUX 5222 are controlled by a BIST control signal, as discussed above. The SIMUXes are implemented to support CAPTURE/SHIFT scan mode selection. The Q output of the LockUp_Latch 5314 is connected to the input of the inverter 5308, whose output is connected to the input of a NOR gate 5310. The D input of the HPP_Latch 5302 is connected to the sense amplifier 5102, the Q output of the HPP_Latch 5302 is connected to one of the inputs of the SOMUX 5304, which has other inputs coupled to Q_RIO (Q Right Input-Output) and the Q output of the Shadow_Latch 5312. The output of the SOMUX 5304 is connected to the inverter 5306. The SOMUX 5304 is controlled by the selector signal HIT+ DFTBYP. Both SIMUX's 5212 and 5214 are controlled by the selector signal HIT+SE. The SOMUX 5304 is implemented to support NORMAL/CAPTURE mode output data selection. In the NORMAL mode, the NORMAL path goes from the MUXes 5222 and 5224, to the level shifters 5218 and 5220, then to the SIMUXes 5212 and 5214. On proper HIT+SE selector value, the signals pass through to LPP_Latches 5206 and 5208, then to the inverters 5108 and 5110, then to the NAND gates 5104 and 5106, then to the sense amplifier 5102, then to the HPP_Latch 5302, then to the SOMUX 5304 and the inverter 5306. The NORMAL path associated with the NORMAL mode is 5510. For clarity of illustration, another NORMAL path along MUX 5224, level shifter 5220, SIMUX 5214 and LPP_Latch 5208 is not shown in FIG. 5.

In the CAPTURE mode, the CAPTURE path goes to the XOR 5202, instead of inverters 5108 and 5110. After the XOR operation, the CAPTURE path passes to the Shadow_Latch 5312, then to the SOMUX 5304 and the inverter 5306. The CAPTURE path associated with the CAPTURE mode is 5530. For clarity of illustration, another CAPTURE path along MUX 5224, level shifter 5220, SIMUX 5214 and LPP_Latch 5208 is not shown in FIG. 5.

In the SHIFT mode, the SHIFT path starts with SID, then through the level shifter 5216, into the SIMUX 5212, then to the LPP_Latch 5206, then to the XOR 5202, then to the Shadow_Latch 5312, then to the LockUp_Latch 5314, then to the inverter 5308 and NOR gate 5310. The SHIFT path associated with the SHIFT mode is represented by dashed line 5520.

Figure 6:
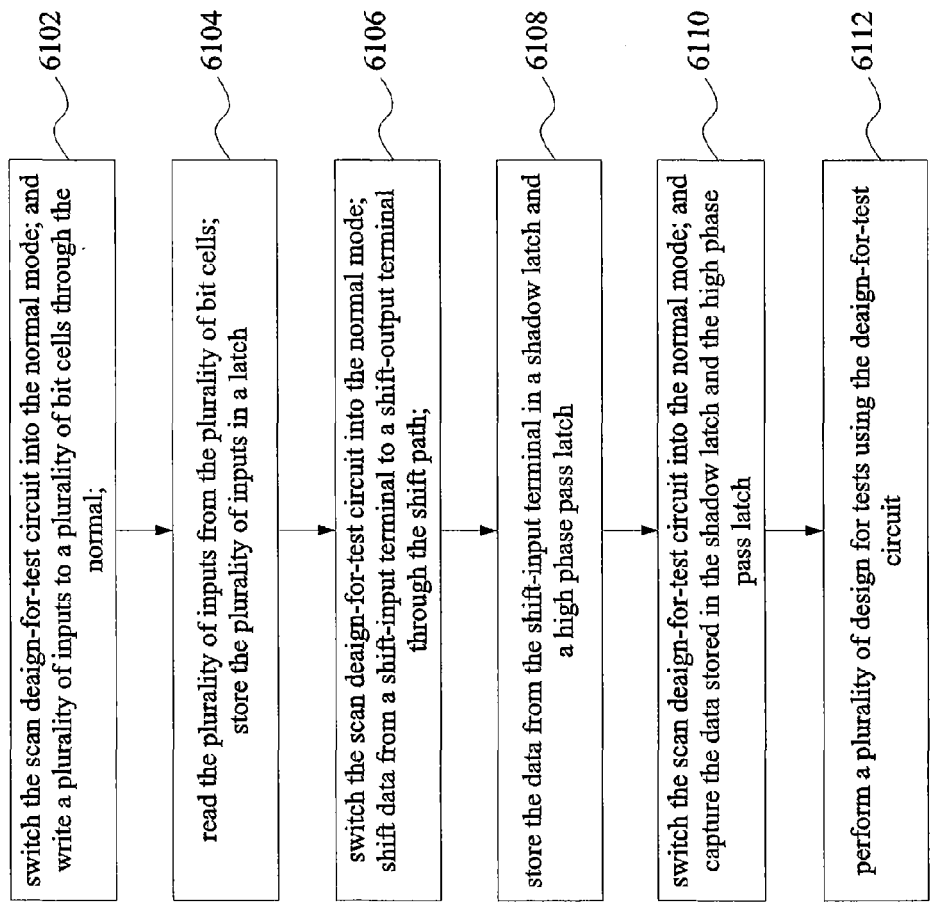
FIG. 6 is a flow chart illustrating a method for a scan DFT circuit in accordance with some embodiments.

FIG. 6 is a flow chart illustrating a method for scan DFT in accordance with some embodiments. At step 6102, a scan DFT circuit is switched into a NORMAL mode, and input vectors are written to bit cells through a NORMAL path. Then at step 6104, data are read out from bit cells and stored in a HPP latch. At step 6106, the DFT circuit is switched to a SHIFT mode, and data are shifted through a predetermined SHIFT path from a shift input terminal to a shift output terminal of the scan DFT circuit. At step 6108, data from the shift input terminal (i.e., SID) are stored in a shadow latch and a HPP latch. At step 6110, the scan DFT circuit is switched to a CAPTURE mode, and data stored in the shadow latch and HPP latch are captured. At step 6112, a user can perform various testing with data obtained from the above steps according to specific testing requirements. In performing the above steps, switching between different modes and paths enables the added testing features to be implemented in the same integrated circuit hardware.

In some embodiments, a scan DFT circuit includes a memory logic unit (e.g., 1100) coupled to a plurality of bit cells (e.g., bit cells 1402) configured to control read and write of data to and from the plurality of bit cells, and an input unit (e.g., 1200, supply voltage for memory array and core device,) formed on the integrated circuit, and an output unit (e.g., 1300, supply voltage for peripheral,) formed on the integrated circuit. The input unit (e.g., 1200) includes a first plurality of multiplexers for signal selection. The output unit includes a second plurality of multiplexers for signal selection, at least one high phase pass latch for storing data and configured to allow the data to pass through when a clock applied to the at least one high phase pass latch has a high phase, at least one lock up latch for storing data and configured to increase a hold time for the data, and at least one shadow latch configured to store a copy of the data stored in the at least one lock up latch. Electronic connections are established between the memory core logic sub-unit (e.g., 1100) and the output unit (e.g., 1300), between the memory core logic sub-unit and the input unit (e.g., 1200), and between the input unit (e.g., 1200) and the output unit (e.g., 1300).

The circuit further includes a shift path (e.g., 1520) proceeding from the input unit (e.g., 1200) to the output unit (e.g., 1300). The circuit further includes a capture path (e.g., 1530) proceeding from the input unit (e.g., 1200) to the memory logic unit (e.g., 1100), then to the output unit (e.g., 1300). The circuit further includes a normal path (e.g., 1510) proceeding from the input unit (e.g., 1200) to the memory logic unit (e.g., 1100), to the bit cells (e.g., 1402), then back to the memory logic unit (e.g., 1100) m then to the output unit (e.g., 1300).

In some embodiments, a scan DFT circuit is disclosed. The circuit includes: a first multiplexer (e.g., SIMUX 2202), a second multiplexer (e.g., SIMUX 2204), a third multiplexer (e.g., SIMUX 2212), a fourth multiplexer (e.g., SIMUX 2214), a shadow latch (e.g., 2316), a lockup latch (e.g., 2318), a first logic gate (e.g., 2210), and a second logic gate (e.g., 2110, NAND_EN). The first logic gate has a plurality of inputs coupled to outputs of at least two of the first plurality of multiplexers (e.g., 2206, 2208), and an output coupled to inputs of at least another two of the first plurality of multiplexers (e.g., 2202, 2204). The first multiplexer (e.g., SIMUX 2202) has a first input, a second input and an output. The second multiplexer (e.g., SIMUX 2204) has a first input, a second input and an output, the first input of the first multiplexer (e.g., SIMUX 2202) is connected to the first input of the second multiplexer (e.g., SIMUX 2204). The third multiplexer (e.g., SIMUX 2212) has a first input, a second input, a third input, an output and a selector, the output of the third multiplexer (e.g., SIMUX 2212) is connected to the input of a first LPP (Low Phase Pass) latch (e.g., 2206). The fourth multiplexer (e.g., SIMUX 2214) has a first input, a second input, a third input, an output and a selector, the output of the fourth multiplexer (e.g., SIMUX 2214) is connected to the input of a second LPP latch (e.g., 2208), and the first input of the third multiplexer (e.g., SIMUX 2212) is connected to the first input of the fourth multiplexer (e.g., SIMUX 2214), the selector of the third multiplexer (e.g., SIMUX 2212) is connected to the selector of the fourth multiplexer (e.g., SIMUX 2214) and both selectors are connected to signal HIT+SE. The shadow latch (e.g., 2316) has an input and an output, the input of the shadow latch (e.g., 2316) is connected to the output of the second multiplexer (e.g., SIMUX 2204). The lock-up latch (e.g., 2318) has an input and an output, the input of the lock-up latch (e.g., 2318) is connected to the output of the shadow latch (e.g., 2316). The first logic gate (e.g., 2210) has a first input, a second input and an output, the output of the first logic gate (e.g., 2210) is connected to the first input of the first multiplexer (e.g., SIMUX 2202) and the first input of the second multiplexer (e.g., SIMUX 2204), the output of the first LPP latch (e.g., 2206) is connected to an input of the first logic gate (e.g., 2210) and, and the output of the second LPP latch (e.g., 2208) is connected to the other input of the first logic gate (e.g., 2210). The second logic gate (e.g., 2110, NAND_EN) has a first input, a second input and an output, an input of the second logic gate (e.g., 2110) is connected to the output of the second multiplexer (e.g., SIMUX 2204) and the input of the shadow latch (e.g., 2316).

In further embodiments, a scan DFT circuit is disclosed. The circuit includes: a first multiplexer (e.g., SIMUX 5212), a second multiplexer (e.g., SIMUX 5214), a first logic gate (e.g., 5202), a shadow latch (e.g., 5312), a lockup latch (e.g., 5314), and a third multiplexer (e.g., SOMUX 5304). The first multiplexer (e.g., SIMUX 5212) has a first input, a second input, a third input, an output and a selector, the output of the first multiplexer (e.g., SIMUX 5212) is connected to an input of a first LPP latch (e.g., 5206). The second multiplexer (e.g., SIMUX 5214) having a first input, a second input, a third input, an output and a selector, the output of the second multiplexer (e.g., SIMUX 5214) is connected to an input of a second LPP latch (e.g., 5208), the selector of the first multiplexer (e.g., SIMUX 5212) is connected to the selector of the second multiplexer (e.g., SIMUX 5214) and both selectors are connected to signal HIT+SE. The first logic gate (e.g., 5202) has a first input, a second input and an output, the first input is connected to the output of the first LPP latch (e.g., 5206), and the second input is connected to the output of the second LPP latch (e.g., 5208). The shadow latch (e.g., 5312) has an input and an output, the input of the shadow latch (e.g., 5312) is connected to the output of the first logic gate (e.g., 5202). The lockup latch (e.g., 5314) has an input and an output, the input of the lockup latch (e.g., 5314) is connected to the output of the shadow latch (e.g., 5312). The third multiplexer (e.g., SOMUX 5304) has a first input, a second input, a third input and an output, the first input of the third multiplexer (e.g., SOMUX 5304) is connected to the output of the shadow latch (e.g., 5312) and the input of the lockup latch (e.g., 5314), and selector of the third multiplexer (e.g., SOMUX 5304) is connected to signal HIT+DFTBYP.

In further embodiments, a method for scan design-for testing (DFT) is disclosed. The method includes providing a scan DFT circuit, the scan DFT circuit comprises a normal mode, a shift mode and a capture mode, the scan DFT circuit comprises a normal path corresponding to the normal mode, a shift path corresponding to the shift mode, and a capture path corresponding to the capture mode; switching the scan DFT circuit into the normal mode; writing a plurality of inputs to a plurality of bit cells through the normal path (e.g., step 6102). Then reading the plurality of inputs from the plurality of bit cells and storing the plurality of inputs in a latch (e.g., step 6104). In further embodiments, the method includes switching the scan DFT circuit into the shift mode; shifting data from a shift-input terminal to a shift-output terminal through the shift path (e.g., step 6106); storing the data from the shift-input terminal in a shadow latch and a high phase pass latch (e.g., step 6108). In further embodiments, the method includes switching the scan DFT circuit into the capture mode and capturing the data stored in the shadow latch and the high phase pass latch (e.g., step 6110). In further embodiments, the method includes performing a plurality of design-for tests (e.g., step 6112).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
 a memory logic unit coupled to a plurality of bit cells configured to control read and write of data to and from the plurality of bit cells;
 an input unit formed on the integrated circuit, the input unit comprising:
  a first plurality of multiplexers for signal selection; and
  a first logic gate having a plurality of inputs coupled to outputs of at least two of the first plurality of multiplexers, and an output coupled to inputs of at least another two of the first plurality of multiplexers;
 an output unit formed on the integrated circuit, the output unit comprising:
  at least one output multiplexer for signal selection; and
  at least one high phase pass latch for storing data, and configured to allow the data to pass through when a clock applied to the at least one high phase pass latch has a high phase, at least one lock up latch for storing data and configured to increase a hold time for the data; and
  at least one shadow latch configured to store a copy of the data stored in the at least one lock up latch,
  wherein electronic connections are established between the memory logic unit and the output unit, electronic connections are established between the memory logic unit and the input unit, and electronic connections are established between the input unit and the output unit, so as to provide a first signal path through the input unit, the memory logic unit, and the output unit, for performing normal data write operations, and at least one additional signal path through the input unit and the output unit, for performing at least one scan test operation.

2. The circuit of claim 1, wherein the at least one additional path comprises a shift path.

3. The circuit of claim 1, wherein the at least one additional path comprises a capture path.

4. The circuit of claim 1, wherein the first and second plurality of multiplexers are configured to allow selection between the first signal path and the at least one additional signal path.

5. The circuit of claim 4, wherein the first latch and the second latch are low-phase pass latches, the third latch is a shadow latch, the fourth latch is a lock-up latch, and the fifth latch is a high-phase pass latch.

6. A circuit, comprising:
a first multiplexer having a first input, a second input and an output;
a second multiplexer having a first input, a second input and an output,
wherein the first input of the first multiplexer is connected to the first input of the second multiplexer;
a third multiplexer having a first input, a second input, a third input, an output and a selector, wherein the output of the third multiplexer is connected to the input of a first latch;
a fourth multiplexer having a first input, a second input, a third input, an output and a selector, wherein the output of the fourth multiplexer is connected to the input of a second latch, and the first input of the third multiplexer is connected to the first input of the fourth multiplexer, wherein the selector of the third multiplexer is connected to the selector of the fourth multiplexer and both connected to a first selector signal;
a third latch having an input and an output, wherein the input of the third latch is connected to the output of the second multiplexer;
a fourth latch having an input and an output, wherein the input of the fourth latch is connected to the output of the third latch;
a first logic gate having a first input, a second input and an output, wherein the output of the first logic gate is connected to the first input of the first multiplexer and the first input of the second multiplexer, wherein the output of the first latch is connected to an input of the first logic gate and, and the output of the second latch is connected to the other input of the first logic gate; and
a second logic gate having a first input, a second input and an output, wherein an input of the second logic gate is connected to the output of the second multiplexer and the input of the third latch.

7. The circuit of claim 6, further comprising:
a first level shifter for voltage shifting, wherein the first input of the third multiplexer and the first input of the fourth multiplexer are connected to a first input through the first level shifter.

8. The circuit of claim 6, further comprising:
a second level shifter for voltage shifting;
a third level shifter for voltage shifting;
a fifth multiplexer having a first input, a second input and an output, wherein the output of the fifth multiplexer is connected to the third input of the third multiplexer through the second level shifter; and
a sixth multiplexer having a first input, a second input and an output, wherein the output of the sixth multiplexer is connected to the third input of the fourth multiplexer through the third level shifter.

9. The circuit of claim 6, further comprising:
a third logic gate having an input and an output;
a fourth logic gate having a first input, a second input and an output, wherein the input of the third logic gate is connected to the output of the fourth latch, and the output of the third logic gate is connected to the second input of the fourth logic gate.

10. The circuit of claim 6, further comprising:
a fifth latch having an input and an output;
a seventh multiplexer having a first input, a second input and an output, wherein the output of the fifth latch is connected to the first input of the seventh multiplexer; and
a fifth logic gate having an input and an output, wherein the output of the seventh multiplexer is connected to the input of the fifth logic gate.

11. The circuit of claim 10, further comprising:
a sixth logic gate having a first input, a second input and an output;
a seventh logic gate having a first input, a second input and an output;
a ninth logic gate having an input and an output, wherein the input of the ninth logic gate is connected to both the output of the first multiplexer and the first input of the seventh logic gate, the output of the ninth logic gate is connected to the first input of the sixth logic gate, wherein the second input of the sixth logic gate is connected to the output of the second logic gate and the second input of the seventh logic gate.

12. The circuit of claim 11, further comprising:
a sense amplifier having a first input, a second input and an output, wherein the output of the sixth logic gate is connected to the first input of the sense amplifier, and the output of the seventh logic is connected to the second input of the sense amplifier.

13. The circuit of claim 12, wherein the output of the sense amplifier is connected to the input of the fifth latch, and the second input of the second logic gate is connected to a control signal.

14. A circuit, comprising:
a first multiplexer having a first input, a second input, a third input, an output and a selector, wherein the output of the first multiplexer is connected to an input of a first latch;
a second multiplexer having a first input, a second input, a third input, an output and a selector, wherein the output of the second multiplexer is connected to an input of a second latch, wherein the selector of the first multiplexer is connected to the selector of the second multiplexer and each selector is controlled by a common selector signal;
a first logic gate having a first input, a second input and an output, wherein the first input is connected to the output of the first latch, and the second input is connected to the output of the second latch;
a third latch having an input and an output, wherein the input of the third latch is connected to the output of the first logic gate;
a fourth latch having an input and an output, wherein the input of the fourth latch is connected to the output of the third latch; and
a third multiplexer having a first input, a second input, a third input and an output, wherein the first input of the third multiplexer is connected to the output of the third latch and the input of the fourth latch, and selector of the third multiplexer is connected to a selector signal.

15. The circuit of claim 14, further comprising:
a first level shifter for voltage shifting, wherein the first input of the first third multiplexer is connected to a first input through the first level shifter.

16. The circuit of claim 14, further comprising:
a second level shifter for voltage shifting;
a third level shifter for voltage shifting;
a fourth multiplexer having a first input, a second input, a selector and an output; and
a fifth multiplexer having a first input, a second input, a selector and an output, wherein the selector of the fourth multiplexer is connected to the selector of the fourth multiplexer, and both selectors are connected to a selector signal, wherein the output of the fourth multiplexer is connected to the third input of the first multiplexer through the second level shifter, and the output of the fifth multiplexer is connected to the third input of the second multiplexer through the third level shifter.

17. The circuit of claim 14, further comprising:
a second logic gate having an input and an output;
a third logic gate having a first input, a second input and an output, wherein the output of the fourth latch is connected to the input of the second logic gate, and the output of the second logic gate is connected to the second input of the third logic gate.

18. The circuit of claim 14, further comprising:
a fourth logic gate having an input and an output;
a fifth logic gate having an input and an output;
a sixth logic gate having a first input, a second input and an output;
a seventh logic gate having a first input, a second input, an output, and a sense amplifier, wherein the input of the fourth logic gate is connected to the output of the first latch and the first input of the seventh logic gate, the input of the fifth logic gate is connected to the second latch, wherein the output of the fourth logic gate is connected to the first input of the sixth logic gate, the output of the fifth logic gate is connected to the second input of the sixth logic and the second input of the seventh logic gate.

19. The circuit of claim 18, further comprising:
a sense amplifier having a first input, a second input and an output, wherein the output of the sixth logic gate is connected to the first input of the sense amplifier, and the output of the seventh logic gate is connected to the second input of the sense amplifier.

20. The circuit of claim 19, further comprising:
a fifth latch having an input and an output;
an eighth logic gate having an input and an output, wherein the output of the fifth latch is connected to the second input of the third multiplexer, the output of the third multiplexer is connected to the input of the eighth logic gate.

21. The circuit of claim 14, wherein the first latch and the second latch are low-phase pass latches, the third latch is a shadow latch, the fourth latch is a lock-up latch, and the fifth latch is a high-phase pass latch.

22. A method, comprising:
providing a scan design-for-test circuit, wherein the scan design-for-test circuit comprises a normal mode, at least one test mode, and a first signal path corresponding to the normal mode, and a second signal path corresponding to the at least one test mode;
switching the scan design-for-test circuit into the test mode;
performing a test operation using the second signal path;
switching the scan design-for-test circuit into the normal mode;
writing data to a plurality of bit cells through the first signal path;
reading the data from the plurality of bit cells; and
storing the data in a first latch.

23. The method of claim 22, wherein the test mode comprises a shift mode and performing the test operation comprises:
shifting data from a shift-input terminal to a shift-output terminal through the second signal path; and
storing the data from the shift-input terminal in a second latch and a third latch.

24. The method of claim 23, wherein the test mode comprises a capture mode and performing the test operation comprises:
capturing the data stored in the second latch and the third latch; and
performing at least one data scan test using the second signal path.

* * * * *